United States Patent [19]

Shiokawa et al.

[11] 4,128,819
[45] Dec. 5, 1978

[54] SURFACE ELASTIC WAVE DEVICE

[75] Inventors: Showko Shiokawa, Yokohama; Takaaki Kusakabe, Tokyo; Toyosaka Moriizumi, Tokyo; Tsutomu Yasuda, Tokyo, all of Japan

[73] Assignee: Toko, Inc., Tokyo, Japan

[21] Appl. No.: 800,544

[22] Filed: May 25, 1977

[30] Foreign Application Priority Data

Sep. 30, 1976 [JP] Japan .................. 51-117737
Sep. 30, 1976 [JP] Japan .................. 51-131746[U]
Sep. 30, 1976 [JP] Japan .................. 51-131747[U]

[51] Int. Cl.² ................ H03H 9/04; H03H 9/26; H03H 9/32; H01L 41/10
[52] U.S. Cl. .......................... 333/72; 310/313; 333/30 R
[58] Field of Search .............. 333/72, 71, 30 R; 310/313; 331/107 A

[56] References Cited
FOREIGN PATENT DOCUMENTS
372649 5/1973 U.S.S.R. ................... 333/30 R Primary Examiner—Alfred E. Smith
Assistant Examiner—Marvin Nussbaum

[57] ABSTRACT

A surface elastic wave device comprising a substrate of an insulating material, a thin film of a piezoelectric material provided on said substrate, input transducer means for transmitting surface elastic wave, and output transducer means for receiving the surface elastic wave. At least one of the input and output transducer means includes a comb-like electrode which comprises interdigital fingers, and a plurality of electrodes which extend across the interdigital fingers in opposing relationship with the comb-like electrode, with the thin film being interposed between the plurality of electrodes and the comb-like electrode. The output transducer means may be arranged to receive or eliminate only surface elastic wave which is permitted to propagate in a direction which is different from that perpendicular to the longitudinal direction of the aforementioned interdigital fingers.

5 Claims, 5 Drawing Figures

SURFACE ELASTIC WAVE DEVICE

This invention relates to a surface elastic wave device, and more particularly it pertains to such a device having an improved frequency characteristic and utilizable as a filter.

It is the recent trend that in various fields, use in being made of surface elastic wave devices adapted for effecting electric-mechanical and mechanical-electric conversions wherein an input electric signal is converted into surface elastic wave by input side interdigital-finger comb-like electrode means provided on a piezoelectric base plate and then the surface elastic wave is converted into an electric signal by output side interdigital-finger comb-like electrode means after having propagated along a path in the piezoelectric base plate. Such devices can be employed as filters, delay lines and so forth to achieve desired frequency characteristics and delay characteristics, and are advantageous in that they can be produced by making use of integrated circuit techniques and require no adjustment.

In surface elastic wave devices of the foregoing type, the wavelength, or the center frequency of the surface elastic wave produced therein is determined in dependence on the spacing between adjacent ones of the interdigital fingers of each comb-like electrode used therein, and the surface elastic wave having the wavelength thus determined is caused to propagate in a direction perpendicular to the longitudinal direction of the interdigital fingers. In such a case, however, the wavelength of the excited surface elastic wave is not necessarily constant but falls within a predetermined band; thus, the frequency characteristic of such a surface elastic wave device also has a predetermined band in the vicinity of the center frequency which depends on the spacing or interval between the interdigital fingers. In case such a device is used as a filter or the like, it is required that a predetermined characteristic be realized in respect of frequency band, selectivity and so forth.

In order to improve the frequency characteristics of surface elastic wave devices, various attempts have heretofore been made with respect to the electrode construction and configuration of such devices. It has been proposed to improve the characteristics by making so-called weighting, that is, by changing the overlapping length of the interdigital fingers of each comb-like electrode, but such proposal presents a problem that the design of the electrode pattern becomes complicated so that difficulties are experienced in the manufacture of the devices.

In some cases, there is a demand for such a device that surface elastic waves of different frequencies are excited and then only a signal having a predetermined frequency is taken out of the thus excited surface elastic waves. To meet such a demand, it has conventionally been the practice either to provide a plurality of comb-like electrodes at the input side to excite surface elastic waves of different frequencies or provide a plurality of output side electrodes each adapted to respond to surface elastic wave of different frequency. Even when plural electrodes are provided as mentioned above, however, difficulty is encountered in an attempt to take out a predetermined particular frequency since the surface elastic waves are transmitted and received with a predetermined band width. In order to make the band width narrower, it is necessary to increase the number of interdigital finger pairs of each comb-like electrode. As mentioned above, the conventional device constituting a filter is disadvantageous in that the construction and electrode configuration thereof are complicated.

Accordingly, it is an object of this invention to provide a surface elastic wave device which is free from the aforementioned drawbacks of the prior art, makes it possible to achieve desired frequency characteristics with simplified construction, is easy to design and can filter out a predetermined particular frequency to be taken out to be used or eliminated.

In the prior-art surface elastic wave device, a single wave source or input electrode has been used and it has been attempted to improve the characteristics by means of the configuration of such a single electrode alone, while in the surface elastic wave device according to this invention, cyclic nature is imparted to the distribution of excitation by wave sources, thereby improve the characteristics thereof.

In the process of making this invention, the inventors have carried out observations concerning variations with frequency in propagation pattern of surface elastic waves and as a result recognized that when an input electric signal is applied to interdigital-finger comb-like electrode to excite surface elastic wave, the resultant wave propagates in a direction perpendicular to the longitudinal direction of the interdigital fingers and that at the same time, surface elastic wave having a different propagation direction is excited out of the end of the comb-like electrode. It has also been found that the surface elastic wave excited out of the end of the comb-like electrode has a frequency different from the center frequency which depends on the spacing between the interdigital fingers of the comb-like electrode.

It is considered that the phenomenon mentioned above occurs for the following reason: When surface elastic wave is excited by a comb-like electrode, the propagation direction of such a wave is determined by a component perpendicular to the longitudinal direction of the interdigital fingers constituting the comb-like electrode and a component parallel with the longitudinal direction of the interdigital fingers. In the case of an ordinary comb-like electrode, most of the surface elastic waves produced thereby are permitted to propagate perpendicularly with respect to the longitudinal direction of the interdigital fingers since the perpendicular component is dominant, but at the end of the electrode, the parallel component occurs predominantly so that the surface elastic wave produced thereat is caused to propagate in a different direction.

Thus combining the perpendicular and parallel components, it is possible to cause surface elastic wave of a desired frequency to be propagated in a direction with a predetermined angle to the direction perpendicular to the longitudinal direction of the interdigital fingers. In view of this, the inventors have thought out a surface elastic wave using wave sources of cyclic nature instead of employing single wave source as is the case with prior art, thereby making it possible to set up the proportion between the perpendicular and parallel components as desired. By virtue of the cyclic nature of the comb-like electrode, surface elastic waves produced at the respective portions of the comb-like electrode are strengthened together or amplified so as to be utilized.

Other objects, features and advantages of this invention will become apparent from the following description taken in conjunction with accompanying drawings.

Figure 1:
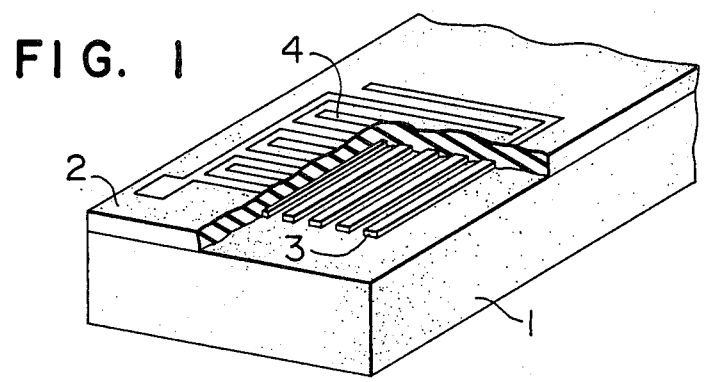
FIG. 1 is a fragmentary perspective view showing the surface elastic wave device according to an embodiment of this invention.

Referring to FIG. 1 of the drawings, there is shown, in a perspective view, an example of the surface elastic wave device according to this invention, wherein a thin film 2 of a piezoelectric material is provided on a substrate 1 of an insulating material. The thin film 2 may be formed of such a material as ZnO, $LiTaO_3$, CdS, $BiTiO_3$ or the like or any other piezoelectric material having a high coupling coefficient. The thickness of the thin film is made so that the coupling coefficient becomes maximum, thus resulting in a high conversion efficiency. Between the substrate 1 and the thin film 2 is provided an electrode 3 which forms cyclic or periodic wave sources. The electrode 3 comprises a plurality of metal strips extending across the interdigital fingers of a comb-like electrode 4 provided on the thin film 2. The electrode 3 may be formed by means of a vapour deposition process or the like. The interdigital fingers of the comb-like electrode 4 may be equal in length to each other.

The comb-like electrode 4 is substantially divided by the electrode 3 forming cyclic wave sources. Thus, surface elastic waves will be excited at positions which are in opposing relationship to the electrode 3, but at positions which are not in opposing relationship to the electrode 3, either no surface elastic waves are excited or the amplitude of the surface elastic waves becomes very low. This is due to the fact that the electrode forming cyclic wave sources establishes portions in which there occurs a high electric-mechanical coupling and portions in which no such high coupling occurs, whereby the comb-like electrode 4 is divided into sections equal in number to the electrode segments serving as the cyclic wave sources respectively.

When an input electric signal is applied to the comb-like electrode 4, a plurality of surface elastic waves will be excited out of those portions of the comb-like electrode 4 which constitute a plurality of wave sources, and the thus excited surface elastic waves will be permitted to propagate in a direction which is perpendicular to the longitudinal direction of the interdigital fingers. In the case where use is made of such wave sources as mentioned above, surface elastic waves having a predetermined particular frequency different from a center frequency determined in dependence on the spacing between the interdigital fingers of the comb-like electrode 4 will be permitted to propagate in a direction different from the aforementioned direction which is perpendicular to the longitudinal direction of the interdigital fingers. Such surface elastic waves are produced at the respective portions of the comb-like electrode divided as mentioned above, and in this case, due to the cyclic or periodic nature of the comb-like electrode 4, that component of each of these surface elastic waves having the foregoing predetermined particular frequency becomes dominant so that the last-mentioned surface elastic waves are intensified or amplified and permitted to propagate in the predetermined direction mentioned above.

The center frequency of the surface elastic wave device mentioned above depends on the spacing between the interdigital fingers of the comb-like electrode, whereas the frequency of surface elastic waves which propagate in a direction different from that of the surface elastic waves having a frequency corresponding to the foregoing center frequency depends on the construction of the comb-like electrode 4 and that of the electrode 3 forming cyclic wave sources. Thus, by adjusting the construction of the comb-like electrode 4 and the number of the segments of the electrode 3, width thereof and spacing therebetween, it is possible to cause surface elastic wave having a desired frequency to propagate in a direction different from that of the center-frequency surface elastic wave.

Figure 2:
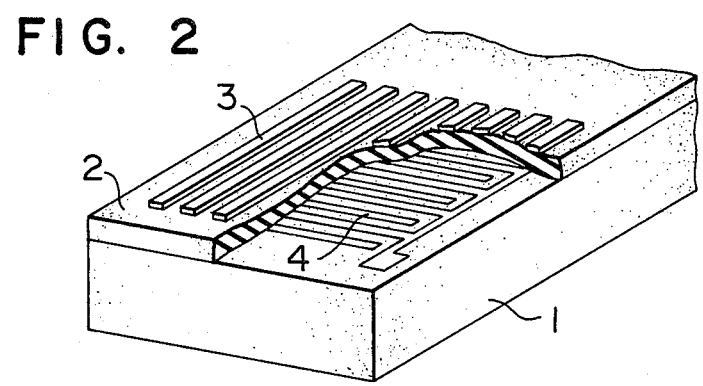
FIG. 2 is a fragmentary perspective view showing a second embodiment of this invention.

FIG. 2 shows a second embodiment of this invention, wherein the positions of the electrodes 3 and 4 are exchanged, with the comb-like electrode 4 provided on the substrate 1 of an insulating material and with the electrode 3 provided on the thin film 2 of a piezoelectric material. It goes without saying that the above-described construction is applicable not only to an input transducer but also to an output transducer.

Figure 3:
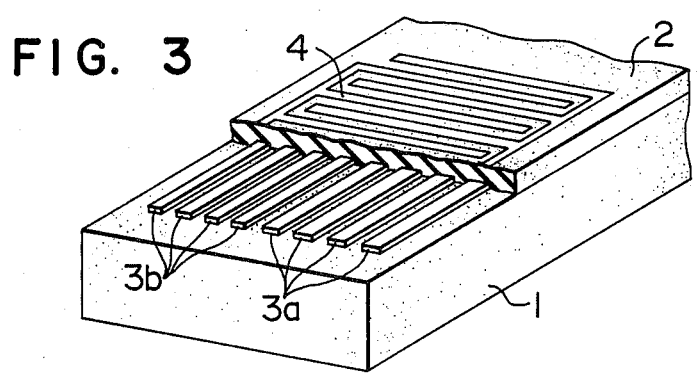
FIG. 3 is a fragmentary perspective view showing a third embodiment of this invention.

FIG. 3 is a fragmentary perspective view showing a third embodiment of this invention, wherein an electrode 3 forming cyclic or periodic wave sources is provided on a substrate 1 of an insulating material, those electrode segments of the electrode 3 which are represented by 3a being differentiated in respect of width from the remaining electrode segments thereof which are denoted by 3b. In other words, the electrode segments 3a are equally spaced from each other, and the electrode segments 3b are also equally spaced from each other, but the spacing between the electrode segments 3a is different from the spacing between the electrode segments 3b. A comb-like electrode 4 is provided in opposing relationship with the electrode 3 through a thin film 2 of a piezoelectric material. The comb-like electrode 4 is provided with cyclic or periodic nature by the electrode 3, so that the electrode 4 is divided into sections having different cycles instead of a single cycle. Each of these sections has the same center frequency, but due to the fact that the cycles of these sections are different from each other, surface elastic waves which are caused to propagate in a predetermined direction from the electrode segments 3a are differentiated in respect of direction and frequency from surface elastic waves which are caused to propagate in a predetermined direction from the remaining electrode segments 3b.

The difference in cycle is not restricted to the example shown in FIG. 3, but various changes and modifications will become possible; for example, more than three different cycles may be established or there may be provided a plurality of sets of electrode segments which are different from each other in respect of the spacing therebetween or the width thereof. In fact, it is only required that the electrode segments of a respective group be equal to each other in respect of the width therof and spacing therbetween. Also, the center frequency of the comb-like electrode may be changed at the respective portions thereof. In this way, surface elastic waves each having a different frequency can be caused to propagate in different directions respectively.

Figure 4:
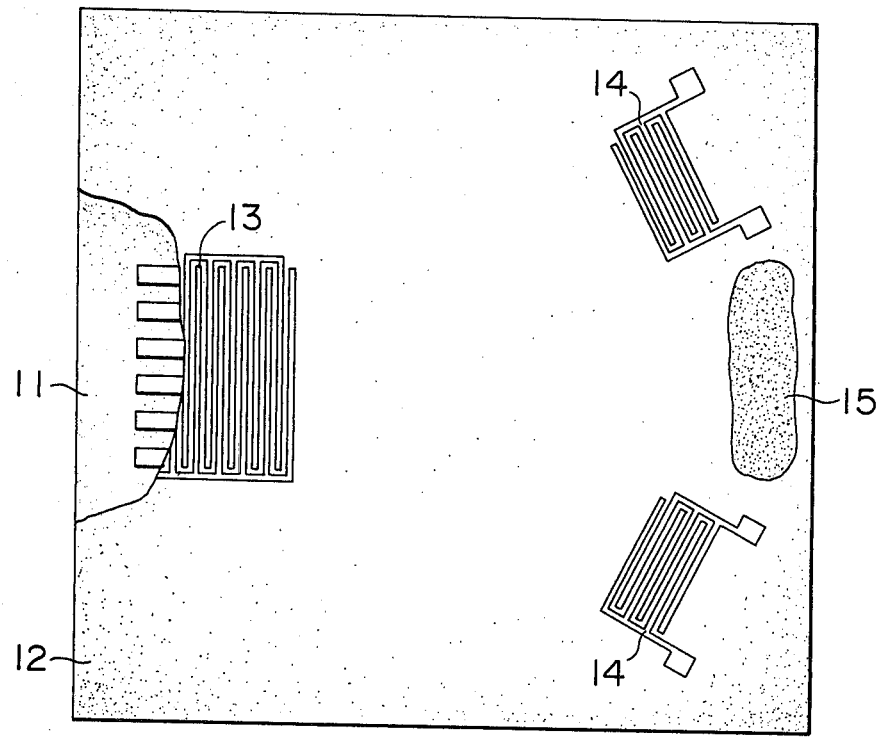
FIGS. 4 and 5 are top plan views, partly cut away, showing the filters embodying this invention, respectively.

FIG. 4 is a top plan view, partly cut away, showing an example of the surface elastic wave filter according to this invention wherein a thin film 12 of a piezoelectric material is provided on a base plate 11 of an insulating material, and there is provided an input transducer 13 which comprises an electrode provided on the base plate to form cyclic or periodic wave sources along with a comb-like electrode provided on the thin film. Alternatively, the input transducer may be constituted by a comb-like electrode which is divided in parallel with each other. On the thin film 12, there are also provided output transducers 14 in the paths along which surface elastic waves provided by the input transducer 13 and having a frequency different from the center frequency thereof are permitted to propagate. The frequency and propagating direction of each of such surface elastic waves are predetermined depending on the cycle and so forth of the input transducer. An absorber material 15 may be provided in the path for unwanted surface elastic waves to absorb such waves.

With such an arrangement of the transducers, only the surface elastic waves having a predetermined frequency are permitted to propagate toward the output transducers 14; thus, it is possible to obtain a filter having a narrow pass-band and high selectivity.

Figure 5:
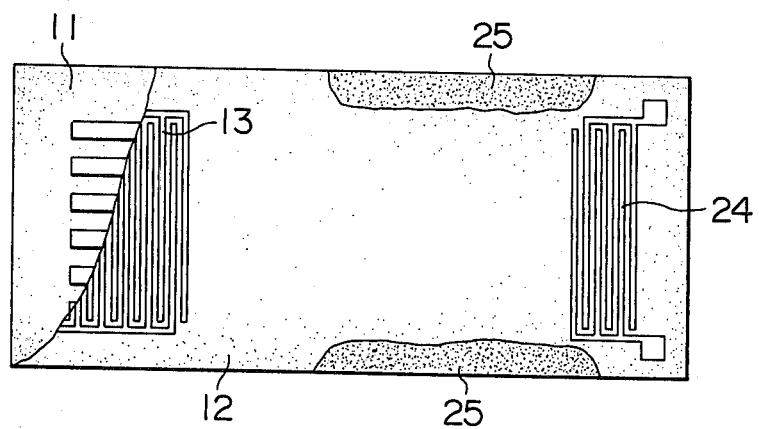

FIG. 5 is a top plan view, partly cut away, showing another example of the filter embodying this invention, which includes an input transducer 13 similar to that shown in FIG. 4 and an output transducer 24 provided in the path along which surface elastic waves having a frequency corresponding to the center frequency are permitted to propagate. Absorbers 25 are provided in the paths along which surface elastic waves each having a frequency different from the aforementioned center frequency are permitted to propagate, respectively. Thus, there is obtained a filter which is capable of damping a predetermined frequency or frequencies.

As will be appreciated from what has been described above, the arrangements shown in FIGS. 4 and 5 may be combined so that the output transducers may pick up surface elastic waves of the center frequency propagating in a direction perpendicular to the longitudinal direction of the interdigital fingers and surface elastic waves whose frequency is different from the center frequency. The thus picked-up surface elastic waves may be utilized either in combination or individually.

By making such a design that the frequency of the surface elastic waves which is different from the center frequency falls within the frequency band of the surface elastic waves propagating perpendicularly with respect to the longitudinal direction of the interdigital fingers, it is possible that these surface elastic waves may be easily combined so as to achieve a frequency band characteristic having a trap.

As will be apparent to those skilled in the art, the filter according to this invention is not restricted to the foregoing examples, but various modifications and combinations will become possible whereby desired frequency characteristics can be achieved.

Unlike the conventional filters designed so that particular surface elastic waves are taken out to be utilized or eliminated from the surface elastic waves which propagate along the same path, the surface elastic wave filter embodying the present invention is designed such that a different propagating path is provided for surface elastic wave of a different frequency so that surface elastic wave having a predetermined frequency may be taken out to be used or eliminated. According to this invention, therefore, there is provided a filter which is arranged such that deterioration of the characteristics by unwanted signal can be minimized and influence of unwanted reflection wave can be easily avoided. Furthermore, according to this invention, it is possible to achieve any desired characteristic simply by utilizing the electrode arrangement; thus, the filter according to this invention is easy to manufacture and can be miniaturized.

As will be appreciated from what has been described above, the surface elastic wave device of this invention is capable of filtering surface elastic waves; thus, according to this invention, there is provided a surface elastic wave device capable of taking out a predetermined frequency alone. Furthermore, it is possible to cause surface elastic waves of a predetermined frequency to be propagated in a different direction, depending on the design of the comb-like electrodes serving as cyclic wave sources, thus resulting in the device having a high selectivity.

By utilizing what has been described just above, it is easily possible to damp a signal having a predetermined frequency. This is because only the surface elastic waves having a predetermined frequency can be caused to propagate outside of the propagating path of the remaining surface elastic waves so as to be removed.

In the surface elastic wave device of this invention, its frequency characteristic per se can be varied by imparting cyclic nature to the wave sources thereof. The cyclic nature of the wave sources can be varied depending on the comb-like electrode pattern alone, so that any desired frequency characteristic can be realized through the design of the comb-like electrodes. This leads to an increased degree of freedom in the design of the surface elastic wave device. Moreover, the surface elastic wave device of this invention can be manufactured easily and miniaturized since it can be produced simply by providing the present electrodes in the conventional device.

Although the present invention has been described with respect to some specific embodiments, it is to be understood that the invention is not restricted thereto but covers any and all modifications and changed which may be made within the scope of the appended claims.

What is claimed is:

1. A surface elastic wave device comprising a substrate of an insulating material, a thin film of a piezoelectric material, provided on said substrate, input transducer means for transmitting a surface elastic wave, and output transducer means for receiving said surface elastic wave, said input transducer means including a comb-like electrode comprising interdigital finger, and a plurality of electrodes extending at right angles across the interdigital fingers of said comb-like electrode in opposing relationship with said comb-like electrode with said thin film interposed therebetween.

2. A surface wave device according to claim 1, wherein said plurality of electrodes comprise a plurality of sets of electrode elements, and wherein in each of said sets, the electrode elements are equal to each other in respect of the width thereof and the spacing therebetween.

3. A surface elastic wave device according to claim 2, wherein the width of and the spacing between the electrode elements are differentiated at least between adjacent ones of said sets.

4. A surface elastic wave device comprising a substrate of an insulating material, a thin film of a piezoelectric material provided on said substrate, input transducer means for transmitting a surface elastic wave, and output transducer means for receiving said surface elastic wave, said input transducer means including a comb-like electrode comprising interdigital fingers, and a plurality of electrodes extending at right angles across the interdigital fingers of said comb-like electrode in opposing relationship with said comb-like electrode with said thin film interposed therebetween, said output transducer being arranged to receive only surface wave permitted to propagate in a direction different from that perpendicular to the longitudinal direction of said interdigital finger, thereby constituting a filter.

5. A surface elastic wave device comprising a substrate of an insulating material, a thin film of a piezoelectric material provided on said substrate, input transducer means for transmitting a surface elastic wave, and output transducer means for receiving said surface elastic wave, said input transducer means including a comb-like electrode comprising interdigital fingers, and a plurality of electrodes extending at right angles across the interdigital fingers of said comb-like electrode in opposing relationship with said comb-like electrode with said thin film interposed therebetween, said output transducer being arranged to eliminate only surface wave permitted to propagate in a direction different from that perpendicular to the longitudinal direction of said interdigital fingers, thereby constituting a filter.

* * * * *